(12) United States Patent
Yang

(10) Patent No.: US 12,021,176 B2
(45) Date of Patent: Jun. 25, 2024

(54) FLIP CHIP, SURFACE LIGHT SOURCE, AND DISPLAY DEVICE USING SURFACE LIGHT SOURCE THEREOF

(71) Applicant: WUHAN CHINA STAR OPTOELECTRONICS TECHNOLOGY CO., LTD., Hubei (CN)

(72) Inventor: Yong Yang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 740 days.

(21) Appl. No.: 16/972,620

(22) PCT Filed: Nov. 1, 2018

(86) PCT No.: PCT/CN2018/113282
§ 371 (c)(1),
(2) Date: Dec. 7, 2020

(87) PCT Pub. No.: WO2020/062417
PCT Pub. Date: Apr. 2, 2020

(65) Prior Publication Data
US 2021/0242378 A1 Aug. 5, 2021

(30) Foreign Application Priority Data
Sep. 27, 2018 (CN) .......................... 201811127432.3

(51) Int. Cl.
*H01L 33/60* (2010.01)
*G02B 5/30* (2006.01)
*H01L 25/075* (2006.01)

(52) U.S. Cl.
CPC ............ *H01L 33/60* (2013.01); *G02B 5/3058* (2013.01); *H01L 25/0753* (2013.01)

(58) Field of Classification Search
CPC ..... G02B 5/3058; H01L 33/60; H01L 33/405; H01L 25/167; H01L 25/0753
See application file for complete search history.

(56) References Cited

U.S. PATENT DOCUMENTS

2009/0236619 A1* 9/2009 Chakroborty ........... H01L 33/50
257/89
2012/0112218 A1 5/2012 Teng et al.
(Continued)

FOREIGN PATENT DOCUMENTS

| CN | 101572286 A | 11/2009 |
| CN | 102244184 A | 11/2011 |

(Continued)

OTHER PUBLICATIONS

Machine language translation of CN 104993039 A (Year: 2015).*
(Continued)

*Primary Examiner* — Erik Kielin
(74) *Attorney, Agent, or Firm* — PV IP PC; Wei Te Chung; Zhigang Ma

(57) ABSTRACT

A flip chip, a surface light source, and a display device using the surface light source are described. The flip chip comprises a metal grid layer having metal wire grid polarizers which are arranged in parallel; a wafer substrate arranged under the metal wire grid polarizer of the metal grid layer; a N-doped layer and a negative-electrode wire, wherein the N-doped layer and the negative-electrode wire are arranged under the wafer substrate; a quantum well layer arranged under the N-doped layer; a P-doped layer arranged under the quantum well layer; an optical activity material layer arranged under the P-doped layer; a reflecting layer arranged under the optical activity material layer; and a positive- (Continued)

electrode wire arranged under the reflecting layer. The present disclosure improves the light-emitting efficiency of the surface light source in large-angle direction and the visual angle range of the surface light source is expanded.

7 Claims, 6 Drawing Sheets

(56) References Cited

U.S. PATENT DOCUMENTS

| | | | |
|---|---|---|---|
| 2013/0161677 A1 | 6/2013 | Lin et al. | |
| 2019/0157622 A1* | 5/2019 | Nawata | G02B 5/3058 |
| 2020/0041807 A1* | 2/2020 | Pastrik | G02B 30/25 |
| 2020/0274025 A1* | 8/2020 | Wang | G02F 1/133514 |

FOREIGN PATENT DOCUMENTS

| | | | |
|---|---|---|---|
| CN | 102263179 A | | 11/2011 |
| CN | 102341740 A | | 2/2012 |
| CN | 104993039 A | | 10/2015 |
| CN | 106684109 A | | 5/2017 |
| CN | 107544180 A | | 1/2018 |
| CN | 208904051 U | | 5/2019 |
| JP | 2003162229 A | | 6/2003 |
| JP | 2009069268 A | * | 4/2009 |

OTHER PUBLICATIONS

Machine language translation of JP-2009069268-A (Year: 2009).*
Chinese Office Action issued in corresponding Chinese Patent Application No. 201811127432.3 dated Jul. 26, 2023, pp. 1-6.

* cited by examiner

FLIP CHIP, SURFACE LIGHT SOURCE, AND DISPLAY DEVICE USING SURFACE LIGHT SOURCE THEREOF

BACKGROUND

Field

The present disclosure relates to a technical field of display devices, and more particularly relates to a flip chip, a surface light source, and a display device using the surface light source thereof.

Background

With the rapid development of technology, people make contact with electronic equipment more and more frequently, and a requirement of a display device (or a display screen) is increased. A mini-LED display device is used as an organic electroluminescent diode (OLED) display device in the future. The mini-LED display device has features of higher brightness, flexible and bendable, and can be used for manufacturing products with high-dynamic contrast display technology, a narrow frame display technology, a special-shaped display technology, and the like, and has become a key market research.

However, in comparison with conventional backlight of products and OLED display devices, the current miniaturized LED display device has the disadvantages that the light-emitting efficiency, the light mixing uniformity, the cost, and the thickness of the module. In terms of light efficiency, the mini-LED display device uses a flexible printed circuit (FPC) or a printed circuit board (printed circuit board) as a direct backlight structure of a substrate. Different refractive indexes cause a part of light of the surface light source to be limited between the optical film and the substrate. The light rays refracted and reflected for multiple times between the optical films causes the loss of light energy and the reduction of the light effect. Even if functional films are used in micro-LED display devices or mini-LED display devices, only the brightness of the micro-LED display devices or mini-LED display devices in the front view direction can be guaranteed. The requirement for high light-emitting efficiency in the large-view-angle direction cannot be met. For the problem, there is no better solution at present.

SUMMARY OF THE DISCLOSURE

The present disclosure is to provide a flip chip, a surface light source, and a display device using the surface light source, and a metal grid layer and an optical activity material layer are used, such that the flip chip enables the emitting light linearly polarized and assembles with a band-pass filtering film, thereby guaranteeing high light-emitting efficiency of the exiting light of a surface light source in a larger visual angle and expanding the visual angle range of the surface light source.

In order to solve the above-mentioned technical problem, the present disclosure provides a flip chip, comprising: a metal grid layer comprising a plurality of metal wire grid polarizers which are arranged in parallel; a wafer substrate arranged under the metal wire grid polarizer of the metal grid layer; a N-doped layer and a negative-electrode wire, wherein the N-doped layer and the negative-electrode wire are arranged under the wafer substrate; a quantum well layer arranged under the N-doped layer; a P-doped layer arranged under the quantum well layer; an optical activity material layer arranged under the P-doped layer; a reflecting layer arranged under the optical activity material layer; and a positive-electrode wire arranged under the reflecting layer.

In an embodiment of the present disclosure, the flip chip is selected from a group consisting of a blue light flip chip, a red light flip chip, and a green light flip chip.

In an embodiment of the present disclosure, in relative to the wafer substrate, arrangement directions of the metal wire grid polarizers in the blue light flip chip are perpendicular to arrangement directions of the metal wire grid polarizers in the red light flip chip, or the arrangement directions of the metal wire grid polarizers in the blue light flip chip are perpendicular to arrangement directions of the metal wire grid polarizers in the green light flip chip.

In an embodiment of the present disclosure, the metal wire grid polarizers are nanowires, and the nanowires are selected from a group consisting of silver nanowires, copper nanowires, nickel nanowires, cobalt nanowires, aluminum nanowires, and aluminum oxide nanowires.

In an embodiment of the present disclosure, a distance between two adjacent metal wire grid polarizers ranges from 50 nm to 200 nm.

In an embodiment of the present disclosure, a thickness of the metal grid layer ranges from 50 nm to 100 nm.

The present disclosure further provides a surface light source using the flip chip as claimed in claim 1, the surface light source comprising: a substrate; a chip layer comprising a plurality of flip chips, wherein a gap is disposed between the flip chips; a band-pass filter film arranged in the gap; and an optical film layer arranged on the chip layer.

In an embodiment of the present disclosure, a plurality of blue light flip chips, red light flip chips, and green light flip chips are arranged in the chip layer.

In an embodiment of the present disclosure, arrangement directions of the metal wire grid polarizers in the blue light flip chip are perpendicular to these of the metal wire grid polarizers in the red light flip chip or the green light flip chip.

The present disclosure further provides a display device using the surface light source, wherein the display device comprises the surface light source and a display panel is disposed above the surface light source.

The flip chip, the surface light source, and the display device using the surface light source of the present disclosure adopt a metal grid layer and an optical activity material layer, such that the flip chip enables the emitting light linearly polarized, e.g., P-polarized light or S-polarized light, and assembles with a band-pass filtering film, thereby guaranteeing high light-emitting efficiency of the exiting light of a surface light source in a larger visual angle and expanding the visual angle range of the surface light source.

BRIEF DESCRIPTION OF THE DRAWINGS

The following embodiments refer to the accompanying drawings for exemplifying specific implementable embodiments of the present disclosure in a suitable computing environment. It should be noted that the exemplary described embodiments are configured to describe and understand the present disclosure, but the present disclosure is not limited thereto.

DETAILED DESCRIPTION OF THE PREFERRED EMBODIMENTS

The following embodiments refer to the accompanying figures for exemplifying specific implementable embodiments of the present disclosure in a suitable environment. It should be noted that the exemplary described embodiments are configured to describe and understand the present disclosure, but the present disclosure is not limited thereto.

Directional terms, such as an upper side, a lower side, a front side, a back side, a left side, a right side, an inner side, an outer side, and a lateral side, mentioned in the present disclosure are only for reference. Therefore, the directional terms are used for describing and understanding rather than limiting the present disclosure. In the figures, units having similar structures are used for the same reference numbers.

Figure 1:
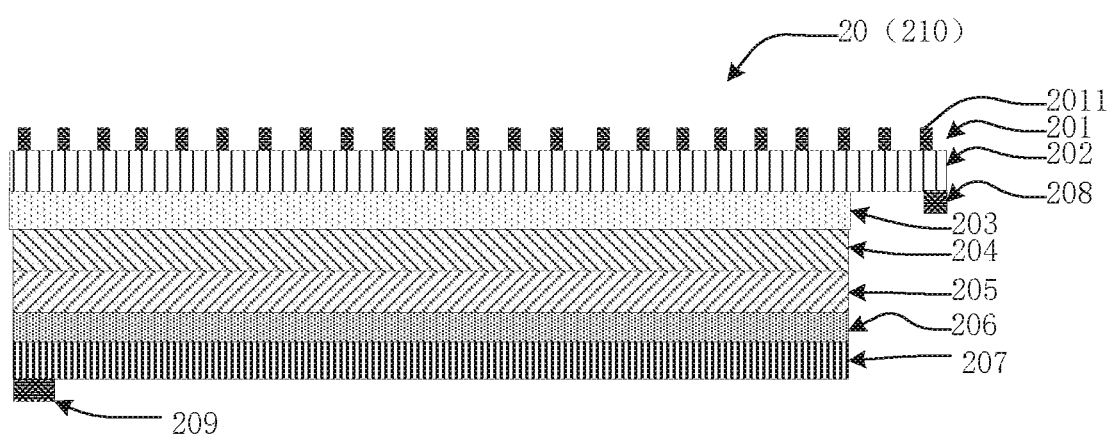
FIG. 1 is a layered structure diagram of a blue light flip chip according to an embodiment of the present disclosure.
Figure 2:
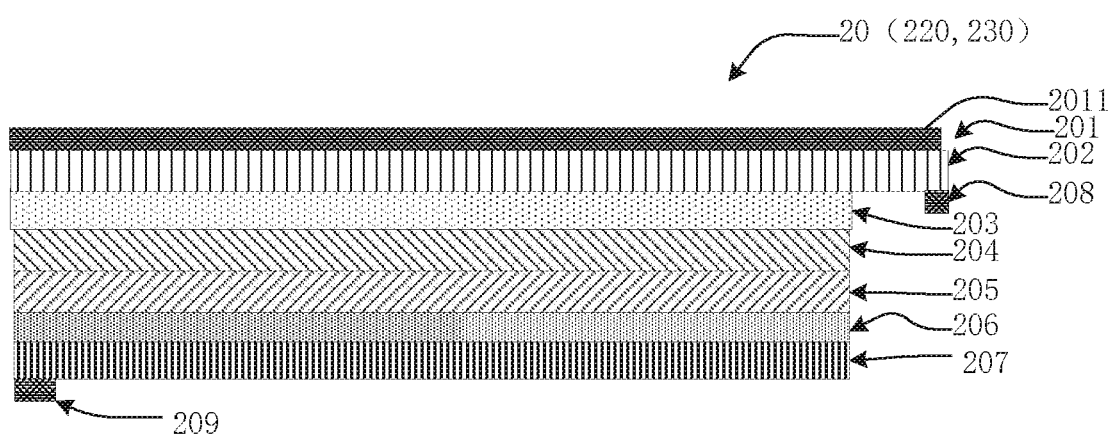
FIG. 2 is a layered structure diagram of a red light flip chip or a green light flip chip according to an embodiment of the present disclosure.

As shown in an embodiment of FIG. 1 and FIG. 2, a flip chip 20 is arranged according to the light primary color design of the surface light source. In the embodiment, the flip chip 20 is selected from a group consisting of a blue light flip chip 210, a red light flip chip 220, and a green light flip chip 230. FIG. 1 is a layered structure diagram of the blue light flip chip 210 according to an embodiment of the present disclosure. FIG. 2 is a layered structure diagram of the red light flip chip 220 or the green light flip chip 230 according to an embodiment of the present disclosure.

As shown in FIG. 1 and FIG. 2, each of the flip chips 20 sequentially from top to bottom includes a metal grid layer 201, a wafer substrate 202, an N-doped layer 203, a quantum well layer 204, a P-doped layer 205, an optical activity material layer 206, and a reflecting layer 207. The flip chip 20 further includes a negative-electrode wire 208 and a positive-electrode wire 209, where the negative-electrode wire 208 is arranged under the wafer substrate 202, and the positive-electrode wire 209 is arranged under the reflecting layer 207.

The metal grid layer 201 is provided with a plurality of metal wire grid polarizers 2011. The metal wire grid polarizers 2011 are arranged on the wafer substrate 202 in parallel. In an embodiment, based on chip design requirement, the thickness of the metal grid layer 201 is in a range from 50 nm to 100 nm. The distance between two adjacent metal wire grid polarizers 2011 is in a range from 50 nm to 200 nm. For example, the metal wire grid polarizers 2011 are nanowires and the nanowires are selected from a group consisting of silver nanowires, copper nanowires and nickel nanowires, cobalt nanowires, aluminum nanowires, and aluminum oxide nanowires.

Compared with the wafer substrate 202, in the flip chips 20 with different primary colors, the arrangement directions of the metal wires 2011 on the wafer substrate 202 are different. In this embodiment, referring to FIG. 1 and FIG. 2, the arrangement directions of the metal wire grid polarizers 2011 in the blue light flip chip 210 are perpendicular to these of the metal wire grid polarizers 2011 in the red light flip chip 220. The arrangement directions of the metal wire grid polarizers 2011 in the blue light flip chip 210 is perpendicular to these of the metal wire grid polarizers 2011 in the green light flip chip 230.

The wafer substrate 202 is disposed under the metal grid layer 201. In an embodiment, the wafer substrate 202 is a sapphire substrate.

The N-doped layer 203 is disposed under the wafer substrate 202. The quantum well layer 204 is arranged under the N-doped layer 203. The P-doped layer 205 is arranged under the quantum well layer 204.

The optical activity material layer 206 is disposed under the P-doped layer 205. After the light passes through the optical activity material layer 206, the vibration surface of the light rotates a predetermined angle at an axis of the light propagation direction. Generally, optical activity material is defined as a kind of substance that enables light linearly polarized to rotate by a predetermined angle after passing the substance. In an embodiment, the optical activity material in the optical activity material layer 206 can be liquid crystal material, mica (quartz stone), or optical activity material with organic small molecule.

The reflecting layer 207 is arranged under the optical activity material layer 206. The positive-electrode wire 209 is arranged under the reflecting layer 207, and the negative wire 208 is arranged under the wafer substrate 202.

For an example of the blue light flip chip 210, a light path of the exiting light emitted by the quantum well layer 204 is described below. The exiting light of the quantum well layer 204 is non-polarized light that is similar to natural light. After the non-polarized light passes through the metal grid layer 201, where the metal grid layer 201 can be served as a polarization light-splitting unit, the non-polarized light is divided into a first polarized light and a second polarized light in a first stage. Meanwhile, the first polarized light is defined as P polarized light and the second polarized light is defined as S polarized light. The first polarized light passes through the metal grid layer 201, and the second polarized light cannot pass through the metal grid layer 201 and is reflected back from the metal grid layer 201. When the reflected second polarized light passes through the optical activity material layer 206, the polarization direction of the reflected second polarized light is changed and the reflected second polarized light enters the optical activity material layer 206 again. At the moment, the second polarized light entering the metal grid layer 201 is divided into a first polarized light and a second polarized light in a next stage. Similarly, only the first polarized light of the next stage can pass through the metal grid layer 201 and the second polarized light of the next stage is reflected back. In the same way as the above-mentioned, the optical activity material layer 206 gradually and completely converting the second polarized light into the first polarized light, such that the first polarized light is transmitted from the metal grid polarizer layer 201, thereby increasing the transmittance of the exiting light emitted from the quantum well layer 204.

For an example of the red light flip chip 220, a light path of the exiting light emitted by the quantum well layer 204 is described below. The arrangement directions of the metal wire grid polarizers 2011 in the blue light flip chip 210 are perpendicular to these of the metal wire grid polarizers 2011 in the red light flip chip 220. The exiting light of the quantum well layer 204 is non-polarized light that is similar to natural light. After the non-polarized light passes through the metal grid layer 201, where the metal grid layer 201 can be served as a polarization light-splitting unit, the non-polarized light is divided into a second polarized light and a first polarized light in the first stage. Meanwhile, the second polarized light passes through the metal grid layer 201, and the first polarized light cannot pass through the metal grid layer 201 and is reflected back from the metal grid layer 201. When the reflected first polarized light passes through the optical activity material layer 206, the polarization direction of the reflected first polarized light is changed and the reflected first polarized light enters the optical activity material layer 206 again. At the moment, the first polarized light entering the metal grid layer 201 is divided into a first polarized light and a second polarized light in a next stage. Similarly, only the second polarized light of the next stage can pass through the metal grid layer 201 and the first polarized light of the next stage is reflected back. In the same way as the above-mentioned, the optical activity material layer 206 gradually and completely converting the first polarized light into the second polarized light, such that the second polarized light is transmitted from the metal grid polarizer layer 201, thereby increasing the transmittance of the exiting light emitted from the quantum well layer 204.

The arrangement directions of the metal wire grid polarizers 2011 in the blue light flip chip 210 is perpendicular to these of the metal wire grid polarizers 2011 in the green light flip chip 230. Thus, in the green light flip chip 230, the light path of the exiting light of the green light flip chip 230 is similar to that of the red light flip chip 220, and is not repeated herein.

Figure 3:
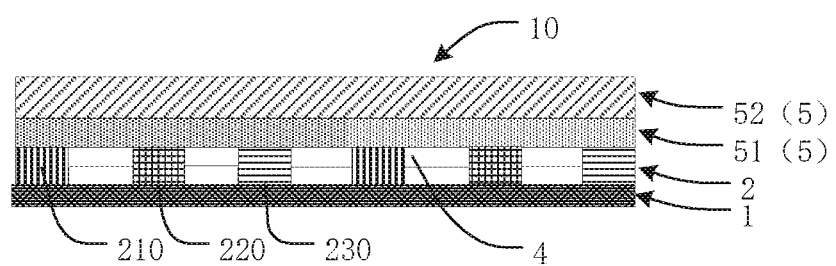
FIG. 3 is a layered structure diagram of a surface light source according to an embodiment of the present disclosure.

As shown in FIG. 3, the flip chip 20 in the embodiment can improve the light-emitting efficiency of the exiting light of a surface light source in a larger visual angle and increase the visual angle range of the surface light source. The present disclosure provides a surface light source 10 including a substrate 1, a chip layer 2, a band-pass filter film 4, and an optical film layer 5.

The substrate 1 can be a flexible printed circuit (FPC) substrate or a printed circuit board (PCB) substrate. In the embodiment, the substrate 1 is a FPC substrate 1.

The chip layer 2 includes a plurality of flip chips 20 and a gap is arranged between the flip chips 20. A plurality of blue light flip chips 210, a plurality of red light flip chips 220, and a plurality of green light flip chips 230 are arranged in the chip layer 2. The blue light flip chips 210, the red light flip chips 220, and the green light flip chips 230 are arranged at intervals in sequence. For example, a blue light flip chip 210, a red light flip chip 220, and a green light flip chip 230 are sequentially and cyclically arranged to from an array matrix. In the chip layer 2, the arrangement directions of the metal wire grid polarizers 2011 in the blue light flip chip 210 are perpendicular to these of the metal wire grid polarizers 2011 in the red light flip chip 220 or the green light flip chip 230.

The band-pass filter film 4 is formed by a low-temperature coating process. In an embodiment, the band-pass filter film 4 is formed by sputtering band-pass filter material on the surface of a fluorescent film at a low temperature. The bandpass filter film 4 is disposed in the gap between the flip chips 20. The band-pass filter material is formed on a surface light source, and the upper portion of the flip chip 20 is not covered by the band-pass filter film 4.

The optical film layer 5 is disposed on the flip chip 20. In an embodiment, the optical film layer 5 includes a diffusion layer 51, the brightness enhancement film 52, where the diffusion layer 51 is arranged on the chip layer 2 and the brightness enhancement film 52 is arranged on the diffusion layer 51.

Figure 4:
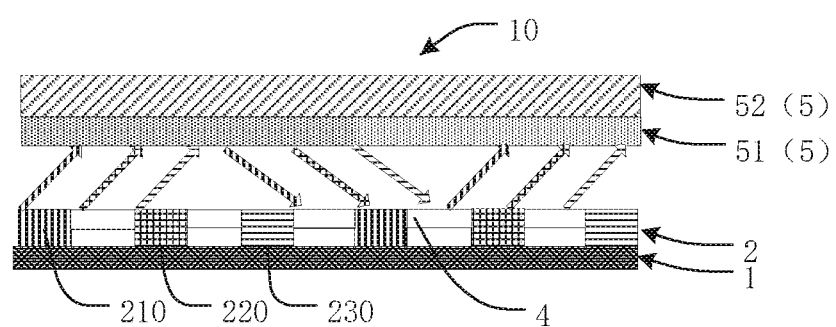
FIG. 4 is a band-pass optical filter diagram of a band-pass filter film in a surface light source according to an embodiment of the present disclosure.

FIG. 4 is a band-pass optical filter diagram of a band-pass filter film 4 in a front-view direction. The light emitted from the flip chip 20 passes through the diffusion layer 51 on the upper layer, a part of reflected light enters the band-pass filter film 4, the band-pass filter film 4 conducts total reflection for the red light and green light with long-wavelength, thereby increasing the utilization rate of the red light and the green light.

Figure 5:
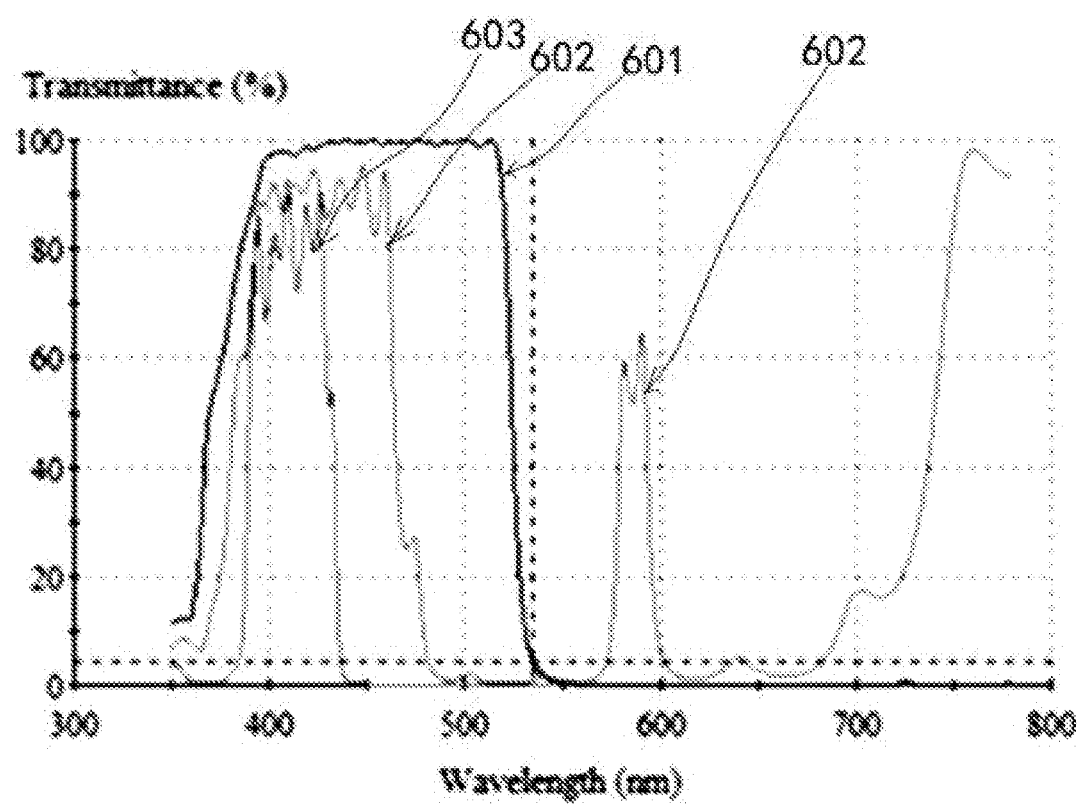
FIG. 5 is a light transmittance spectrum diagram according to an embodiment of the present disclosure.

As shown in FIG. 5, the first curve 601 in FIG. 5 is a light transmittance spectrum of the band-pass filtering film 4 in the front-view direction based on wavelength. If a chip of a surface light source uses a conventional structure chip, the chip is in a large angle direction and a general band-pass filtering film cannot achieve high-transmittance of the blue light and high-reflection effects of the red and green light. If the light-emitting polarization state of the chip is improved and a band-pass filter film 4 structure is used, and better light-emitting efficiency can be achieved within a visual angle range. The second curve 602 in FIG. 5 is a light transmittance spectrum of a P-polarized light at the angle of 70 degrees, and the third curve 603 is a light transmittance spectrum of the S-polarized light at the angle of 70 degrees. In an embodiment, if the surface light source adopts a blue flip chip as shown in FIG. 1, the P-polarized light of the blue light in the blue flip chip can be emitted. If the surface light source adopts the red flip chip or the green flip chip as shown in FIG. 2, the S-polarized light of the red light in the red flip chip and the S-polarized light of the green light in the green flip chip can be emitted, such that the high light transmittance spectrum of the blue light and the high reflectivity of the red and green light in a large visual angle range are guaranteed.

Figure 6:
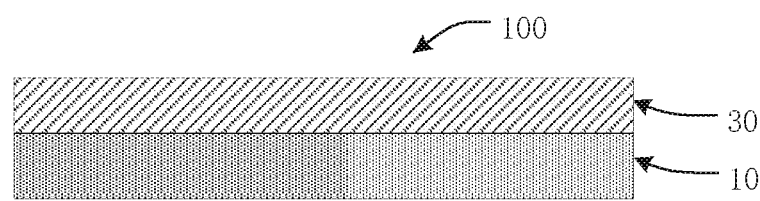
FIG. 6 is a schematic diagram of a display device according to an embodiment of the present disclosure.

As shown in FIG. 6, the display device 100 includes a surface light source 10 and a display panel 30 disposed above the surface light source 10, where the surface light source 10 provides light for the display panel. In an embodiment, the display panel 30 is a liquid crystal display panel. The present disclosure is characterized in the surface light source 10 and the flip chip 20. Therefore, other components of the display device, such as a base, a frame or other films for improving optical quality and the like are not described in detail herein.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A surface light source, wherein the surface light source comprises:
   a substrate;
   a chip layer comprising a plurality of flip chips, wherein a gap is disposed between two adjacent flip chips of the plurality of flip chips;
   a band-pass filter film arranged in the gap; and
   an optical film layer arranged on the chip layer;
   wherein each of the plurality of flip chips comprises:
   a metal grid layer comprising a plurality of metal wire grid polarizers which are arranged in parallel;
   a wafer substrate arranged under the plurality of metal wire grid polarizers of the metal grid layer;
   a N-doped layer and a negative-electrode wire, wherein the N-doped layer and the negative-electrode wire are arranged under the wafer substrate;
   a quantum well layer arranged under the N-doped layer;
   a P-doped layer arranged under the quantum well layer;

an optical activity material layer arranged under the P-doped layer;

a reflecting layer arranged under the optical activity material layer; and a positive-electrode wire arranged under the reflecting layer.

2. The surface light source according to claim 1, wherein the plurality of flip chips comprises a plurality of blue light flip chips, a plurality of red light flip chips, and a plurality of green light flip chips.

3. The surface light source according to claim 2, wherein arrangement directions of the plurality of metal wire grid polarizers in each of the plurality of blue light flip chips are perpendicular to arrangement directions of the plurality of metal wire grid polarizers in each of the plurality of red light flip chips or in each of the plurality of green light flip chips.

4. A display device using the surface light source as claimed in claim 1, wherein the display device comprises the surface light source and a display panel is disposed above the surface light source.

5. The surface light source according to claim 1, wherein the plurality of metal wire grid polarizers are nanowires, and the nanowires are selected from a group consisting of silver nanowires, copper nanowires, nickel nanowires, cobalt nanowires, aluminum nanowires, and aluminum oxide nanowires.

6. The surface light source according to claim 1, wherein a distance between two adjacent metal wire grid polarizers of the plurality of metal wire grid polarizers ranges from 50 nm to 200 nm.

7. The surface light source according to claim 1, wherein a thickness of the metal grid layer ranges from 50 nm to 100 nm.

* * * * *